US012597847B2

(12) United States Patent
Sugimoto et al.

(10) Patent No.: US 12,597,847 B2
(45) Date of Patent: Apr. 7, 2026

(54) POWER CONVERSION CIRCUIT, POWER CONVERSION APPARATUS, AND CONTROL SYSTEM

(71) Applicant: FLOSFIA INC., Kyoto (JP)

(72) Inventors: Masahiro Sugimoto, Kyoto (JP); Shinpei Matsuda, Kyoto (JP)

(73) Assignee: FLOSFIA INC., Kyoto (JP)

( * ) Notice: Subject to any disclaimer, the term of this patent is extended or adjusted under 35 U.S.C. 154(b) by 220 days.

(21) Appl. No.: 18/383,972

(22) Filed: Oct. 26, 2023

(65) Prior Publication Data

US 2024/0072636 A1    Feb. 29, 2024

Related U.S. Application Data

(63) Continuation-in-part of application No. PCT/JP2022/018789, filed on Apr. 25, 2022.

(30) Foreign Application Priority Data

Apr. 26, 2021    (JP) ................................. 2021-074521
Apr. 26, 2021    (JP) ................................. 2021-074522

(51) Int. Cl.
H02M 1/08        (2006.01)
H03K 17/08      (2006.01)
(Continued)

(52) U.S. Cl.
CPC .............. H02M 1/08 (2013.01); H03K 17/08 (2013.01); H02M 3/155 (2013.01); H02M 7/48 (2013.01)

(58) Field of Classification Search
CPC .... H02M 1/08; H02M 7/5387; H02M 1/0095; H02M 1/088; H02M 1/0054;
(Continued)

(56) References Cited

U.S. PATENT DOCUMENTS

2015/0236617 A1*    8/2015  Pahlevaninezhad ........................
H02M 7/5387
363/132
2017/0077084 A1      3/2017  Shirakawa
(Continued)

FOREIGN PATENT DOCUMENTS

| JP | 2002-199699 | 7/2002 |
|----|-------------|--------|
| JP | 2017-59667  | 3/2017 |

(Continued)

OTHER PUBLICATIONS

International Search Report (ISR) issued Aug. 9, 2022 in International (PCT) Application No. PCT/JP2022/018789.
(Continued)

*Primary Examiner* — Kyle J Moody
(74) *Attorney, Agent, or Firm* — Wenderoth, Lind & Ponack, L.L.P.

(57) ABSTRACT

Provided is a power conversion circuit, including: a first switching element and a second switching element connected in parallel to each other; and a control unit configured to control turn-on/off of each of the switching elements, wherein a current value at a cross point of current-voltage characteristics when a forward current flows through the first switching element and current-voltage characteristics when a current flows through the second switching element is greater than a rated current value of the power conversion circuit.

16 Claims, 7 Drawing Sheets

(51) Int. Cl.
  *H02M 3/155* (2006.01)
  *H02M 7/48* (2007.01)
(58) Field of Classification Search
  CPC ............. H03K 17/08; H03K 17/08142; H03K 17/122; H03K 17/127
  See application file for complete search history.

(56) References Cited

U.S. PATENT DOCUMENTS

| | | | |
|---|---|---|---|
| 2019/0067932 A1* | 2/2019 | Li | H02M 7/2173 |
| 2019/0103806 A1 | 4/2019 | Miyake | |
| 2020/0220449 A1 | 7/2020 | Koishi et al. | |
| 2020/0388684 A1* | 12/2020 | Sugimoto | H10D 62/40 |

FOREIGN PATENT DOCUMENTS

| | | |
|---|---|---|
| JP | 2017-228912 | 12/2017 |
| JP | 2019-68592 | 4/2019 |
| JP | 2020-61810 | 4/2020 |
| JP | 2020-114052 | 7/2020 |
| JP | 2020-141550 | 9/2020 |

OTHER PUBLICATIONS

Kaneko, Kentaro, "Growth and Physical Properties of Corundum-Structured Gallium Oxide Alloy Thin Films", Thesis or Dissertation, Kyoto University, pp. 1-116, Mar. 25, 2013, with English abstract.

* cited by examiner

FIG. 3

POWER CONVERSION CIRCUIT, POWER CONVERSION APPARATUS, AND CONTROL SYSTEM

CROSS REFERENCE TO RELATED APPLICATION

This application is a continuation-in-part application of International Patent Application No. PCT/JP2022/018789 (Filed on Apr. 25, 2022), which claims the benefit of priority from Japanese Patent Application Nos. 2021-074521 and 2021-074522 (filed on Apr. 26, 2021).

The entire contents of the above applications, which the present application is based on, are incorporated herein by reference.

1. Technical Field

The present disclosure relates to a power conversion circuit, a power conversion apparatus, and a control system.

2. Description of the Related Art

In recent years, it is studied in a power conversion circuit to connect a first semiconductor element and a second semiconductor element in parallel and to cause these semiconductor elements to perform switching operation. It is sturdied to use, for example, an MOSFET as the first semiconductor element and to use, for example, an IGBT as the second semiconductor element. It is studied to improve characteristics of the entire power conversion circuit by connecting the switching elements having different characteristics in parallel as described above.

On the other hand, as next-generation switching elements that enable realization of high withstand voltage, low loss, and high heat resistance, semiconductor devices using gallium oxide ($Ga_2O_3$) having a wide bandgap has attracted attention, and are expected to be applied to a power semiconductor device such as inverters and converters. In addition, because of the wide bandgap, application of the semiconductor devices to light emitting/receiving devices such as LEDs and sensors is also expected. Such gallium oxide may control the bandgap by forming a mixed crystal with indium or aluminum singly or in combination, and configure an extremely attractive family of materials as InAlGaO-based semiconductors. Here, InAlGaO-based semiconductors indicate $In_XAl_YGa_ZO_3$ ($0 \leq X \leq 2$, $0 \leq Y \leq 2$, $0 \leq Z \leq 2$, and $X+Y+Z=1.5$ to $2.5$), and may be regarded as a family of materials including gallium oxide.

The first switching element and the second switching element connected in parallel are used for protection from a short-circuit current, for optimization of an on-resistance, and the like. For example, there is a control apparatus configured to, when driving of an IGBT and an MOSFET connected in parallel is controlled and an on-resistance per unit area of the IGBT is greater than an on-resistance per unit area of the MOSFET, turn off the IGBT and then turn off the MOSFET, and to, when the on-resistance per unit area of the IGBT is less than the on-resistance per unit area of the MOSFET, turn off the MOSFET and then turn off the IGBT. Further, there is a power conversion apparatus including: a switching circuit including a first switching element and a second switching element connected in parallel to each other; and a control apparatus configured to selectively perform first switching control for driving the first switching element and second switching control for driving the second switching element based on a current instruction value to the switching circuit and an actual current flowing through the switching circuit, in which, when at least one of the current instruction value and the actual current flowing exceeds a predetermined threshold during the first switching control, the control apparatus changes the switching control to the second switching control.

SUMMARY OF THE INVENTION

According to an example of the present disclosure, there is provided a power conversion circuit, including: a first switching element and a second switching element connected in parallel to each other; and a control unit configured to control turn-on/off of each of the switching elements, wherein a current value at a cross point of current-voltage characteristics when a forward current flows through the first switching element and current-voltage characteristics when a current flows through the second switching element is greater than a rated current value of the power conversion circuit.

According to an example of the present disclosure, there is provided a power conversion circuit, at least comprising, a first switching element and a second switching element connected in parallel to each other; and a control unit configured to control turn-on/off of each of the switching elements, wherein the power conversion circuit comprises a reactor connected in series to the second switching element.

Thus, a power conversion circuit according to the present disclosure enables improvement in short-circuit withstand time while maintaining the switching characteristics.

BRIEF DESCRIPTION OF THE DRAWINGS

FIG. 3 is a diagram illustrating current-voltage characteristics of a first switching element and a second switching element according to embodiments of the present disclosure.

DETAILED DESCRIPTION

Figure 1:
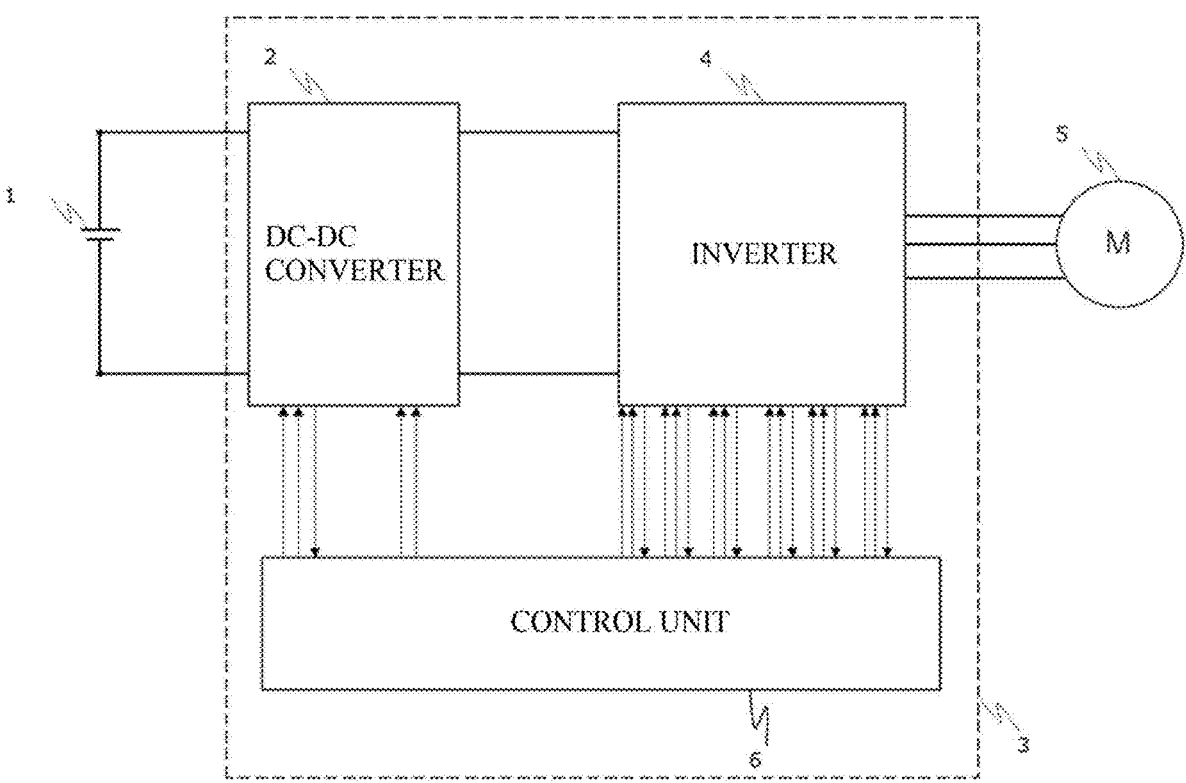
FIG. 1 is a block configuration diagram schematically illustrating a control system according to a first embodiment of the present disclosure.

Note that issues and the like in a case where a switching element actually using gallium oxide is applied to a circuit have not been studied. Further, the control apparatus or the power conversion apparatus has an issue that a plurality of gate drivers is necessary, or control itself is complicated.

The present inventors have found that a power conversion circuit including: a first switching element and a second switching element connected in parallel to each other; and a control unit configured to control turn-on/off of each of the switching elements, in which a current value at a cross point of current-voltage characteristics when a forward current flows through the first switching element and current-voltage characteristics when a current flows through the second switching element is greater than a rated current value of the power conversion circuit enables improvement in short-circuit withstand time without impairing an improvement effect of switching characteristics by the wide bandgap semiconductor such as gallium oxide. Further, the present inventors have found that a power conversion circuit at least including: a first switching element and a second switching element connected in parallel to each other; and a control unit configured to control turn-on/off of each of the switching elements, in which the power conversion circuit includes a reactor connected in series to the second switching element enables improvement in short-circuit withstand time without impairing an improvement effect of switching characteristics by a wide bandgap semiconductor such as gallium oxide. Furthermore, the present inventors have found that such a power conversion circuit makes it possible to solve the above-described existing issues.

Power conversion circuit and Power conversion apparatuses according to embodiments of the present disclosure are described below. Note that the present disclosure is not limited to the embodiments described below.

Embodiments of the present disclosure will be described below with reference to the accompanying drawings. In the following description, the same parts and components are designated by the same reference numerals. The present embodiment includes, for example, the following disclosures.

[Structure 1]

A power conversion circuit, including: a first switching element and a second switching element connected in parallel to each other; and a control unit configured to control turn-on/off of each of the switching elements, wherein a current value at a cross point of current-voltage characteristics when a forward current flows through the first switching element and current-voltage characteristics when a current flows through the second switching element is greater than a rated current value of the power conversion circuit.

[Structure 2]

The power conversion circuit according to [Structure 1], wherein a voltage value at the cross point is twice or more a rated current value of the power conversion circuit.

[Structure 3]

The power conversion circuit according to [Structure 1] or [Structure 2], wherein the second switching element is a switching element including a wide bandgap semiconductor.

[Structure 4]

The power conversion circuit according to any of [Structure 1] to [Structure 3], wherein the second switching element includes a gallium oxide-based MOSFET, a gallium oxide-based IGBT, a gallium nitride-based HEMT, a SiC-based MOSFET, or a SiC-based IGBT.

[Structure 5]

The power conversion circuit according to any of [Structure 1] to [Structure 4], wherein the second switching element is a gallium oxide-based MOSFET.

[Structure 6]

The power conversion circuit according to any of [Structure 1] to [Structure 5], wherein the second switching element is a trench MOSFET.

[Structure 7]

The power conversion circuit according to any of [Structure 1] to [Structure 6], wherein the first switching element includes a silicon-based MOSFET or a silicon-based IGBT.

[Structure 8]

The power conversion circuit according to any of [Structure 1] to [Structure 7], further comprising a diode connected in series to the first switching element.

[Structure 9]

A power conversion circuit, at least including: a first switching element and a second switching element connected in parallel to each other; and a control unit configured to control turn-on/off of each of the switching elements, wherein the power conversion circuit includes a reactor connected in series to the second switching element.

[Structure 10]

The power conversion circuit according to [Structure 9], wherein the second switching element is a switching element including a wide bandgap semiconductor.

[Structure 11]

The power conversion circuit according to [Structure 9] or [Structure 10], wherein the second switching element includes a gallium oxide-based MOSFET, a gallium oxide-based IGBT, a gallium nitride-based HEMT, a SiC-based MOSFET, or a SiC-based IGBT.

[Structure 12]

The power conversion circuit according to any of [Structure 9] to [Structure 11], wherein the second switching element is a gallium oxide-based MOSFET.

[Structure 13]

The power conversion circuit according to any of [Structure 9] to [Structure 12], wherein the first switching element includes a silicon-based MOSFET or a silicon-based IGBT.

[Structure 14]

The power conversion circuit according to any of [Structure 9] to [Structure 13], wherein inductance of the reactor is adjusted to a value causing a voltage applied to the first switching element when a predetermined short-circuit current is generated in the power conversion circuit not to exceed an allowable withstand voltage value of the first switching element.

[Structure 15]

A power conversion apparatus performing power conversion between a power supply and a load, the power conversion apparatus comprising a power conversion circuit provided on a power supply path from the power supply to the load, wherein as the power conversion circuit, the power conversion circuit according to any of [Structure 1] to [Structure 14] is used.

[Structure 16]

A control system using the power conversion circuit according to any of [Structure 1] to [Structure 14] or the power conversion apparatus according to [Structure 15].

A control system in FIG. 1 is mounted on an automobile such as a hybrid vehicle, a fuel-cell vehicle, and an electric vehicle, and performs power conversion between a battery 1 and a motor 5 driving wheels. However, the technique disclosed in the present embodiment is applicable not only to a control system using a power conversion apparatus mounted on an automobile but also to a control system using any of various power conversion apparatuses. A system including the battery 1, the power conversion apparatus 3, and the motor 5 in FIG. 1 configures a control system of the present disclosure.

The motor 5 functions as an electric motor and as a power generator in some cases. When the motor 5 functions as an electric motor, power is supplied from the battery 1 to the motor 5 through the power conversion apparatus 3. In this case, the battery 1 serves as a power supply, and the motor 5 serves as a load. In contrast, when the motor functions as a power generator, power is supplied from the motor 5 to the battery 1 through the power conversion apparatus 3. In this case, the motor 5 serves as a power supply, and the battery 1 serves as a load.

As illustrated in FIG. 1, the power conversion apparatus 3 includes a DC-DC converter 2, an inverter 4, and a control unit 6. The DC-DC converter 2 is provided between the battery 1 and the inverter 4. The DC-DC converter 2 is a step-up/down DC-DC converter, and may step up and down direct-current power between the battery 1 and the inverter 4. The inverter 4 is provided between the DC-DC converter 2 and the motor 5. The inverter 4 is a three-phase inverter, and may perform conversion from direct-current power to three-phase alternating-current power and inverse conversion thereof, between the DC-DC converter 2 and the motor 1.

For example, in the case where the motor 5 functions as an electric motor, the direct-current power supplied from the battery 1 is stepped up by the DC-DC converter 2, the resultant direct-current power is converted into the three-phase alternating-current power by the inverter 4, and the three-phase alternating-current power is then supplied to the motor 5. As a result, the three-phase alternating-current motor 5 is driven by the direct-current power supplied from the battery 1. In contrast, in the case where the motor 5 functions as a power generator, the three-phase alternating-current power supplied from the motor 5 is converted into direct-current power by the inverter 4, the direct-current power is stepped down by the DC-DC converter 2, and the resultant direct-current power is then supplied to the battery 1. As a result, power generated by the motor 5 is charged in the battery 1.

Figure 2:
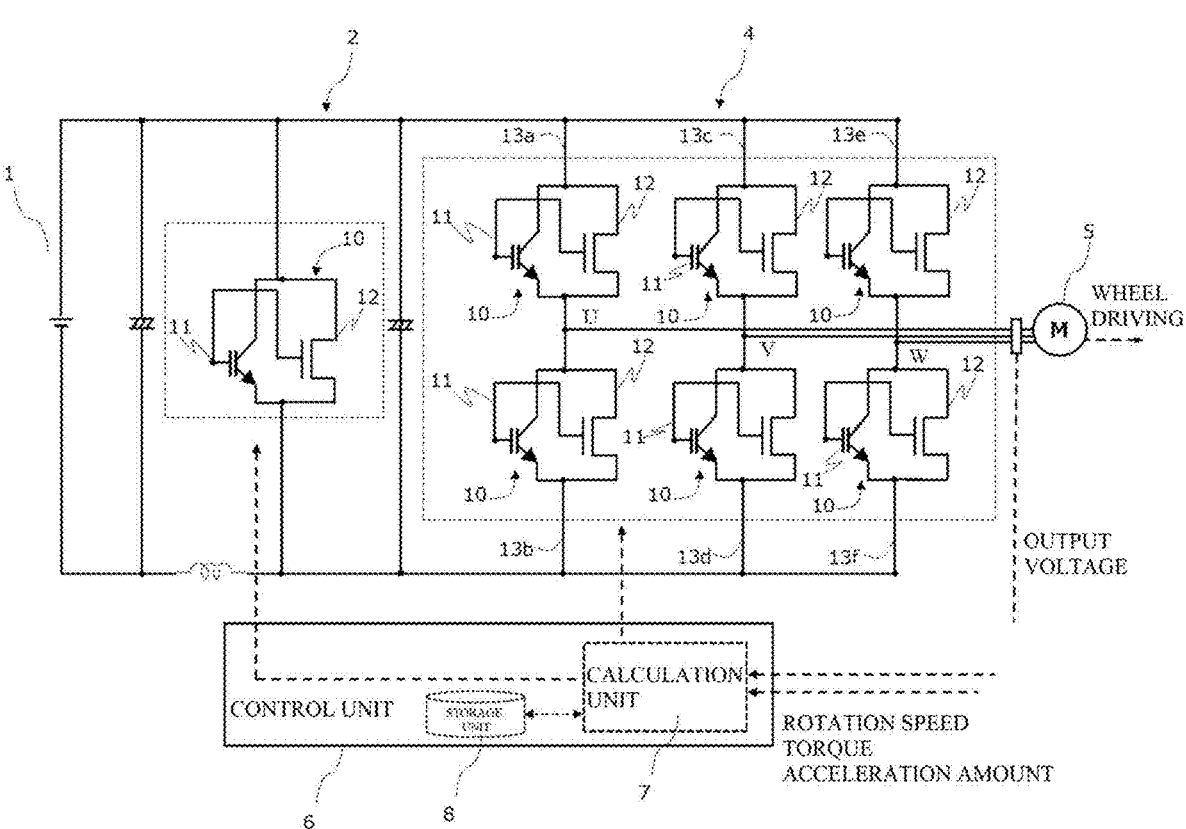
FIG. 2 is a circuit diagram schematically illustrating a power conversion apparatus according to the first embodiment of the present disclosure.

FIG. 2 illustrates an example of circuit configurations of the DC-DC converter 2 and the inverter 4 according to a first embodiment of the present disclosure. As illustrated in FIG. 2, the DC-DC converter 2 and the inverter 4 are configured using a plurality of switching circuits 10. The switching circuits 10 are provided on a power supply path between the battery 1 and the motor 5, and operation of each of the switching circuits 10 is controlled by the control unit 6. Each of the switching circuits 10 includes a first switching element 11 and a second switching element 12. A configuration of each of the switching circuits 10 is described in detail below.

The other configurations of the DC-DC converter 2 and the inverter 4 except for the configurations of the switching circuits 10 are common to configurations of a well-known DC-DC converter and a well-known inverter. For example, the DC-DC converter includes the switching circuit 10, an inductor, and a smoothing capacitor. The inverter 4 includes six switching circuits 10. The switching circuits 10 are provided on a U-phase upper arm 13a, a U-phase lower arm 13b, a V-phase upper arm 13c, a V-phase lower arm 13d, a W-phase upper arm 13e, and a W-phase lower arm 13f The configurations of the DC-DC converter 2 and the inverter 4 in FIG. 2 are illustrative, and are appropriately changeable depending on an application. Furthermore, the power conversion apparatus 3 may include only a step-up (or step-down) DC-DC converter. As illustrated by dotted lines in FIG. 2, a calculation unit 7 including a CPU (Central Processing Unit) and a storage unit 8 including a non-volatile memory are provided in the control unit 6. A signal input to the driving control unit 6 is provided to the calculation unit 7, and the calculation unit 7 generates a feedback signal for each of the switching elements by performing necessary calculation. The storage unit 8 temporarily holds a calculation result of the calculation unit 7 and stores physical constants, functions, and the like necessary for driving control in a format of a table, and appropriately outputs the physical constants, the functions, and the like to the calculation unit 7. Well-known configurations are applicable to the calculation unit 7 and the storage unit 8, and processing capabilities and the like of the calculation unit 7 and the storage unit 8 are also optionally selectable.

Each of the switching circuits 10 includes the first switching element 11 and the second switching element 12. The first switching element 11 and the second switching element 12 are connected in parallel to each other. The first switching element 11 includes, for example, a silicon-based MOSFET or a silicon-based IGBT. The second switching element 12 is not particularly limited unless it interferes with the present disclosure. In the embodiment of the present disclosure, the second switching element is preferably a switching element including a wide bandgap semiconductor (for example, gallium nitride, silicon carbide, gallium oxide, or diamond). For example, the switching element is not particularly limited unless it interferes with the present disclosure, and may be an MOSFET or an IGBT. Examples of the second switching element include a gallium oxide-based MOSFET, a gallium oxide-based IGBT, a gallium nitride-based HEMT, a SiC-based MOSFET or SiC-based IGBT, and a Si-based MOSFET or Si-based IGBT. In the embodiment of the present disclosure, the second switching element is preferably a gallium oxide-based MOSFET, a gallium oxide-based IGBT, a gallium nitride-based HEMT, a SiC-based MOSFET, or a SiC-based IGBT. Further, in the embodiment of the present disclosure, the second switching element preferably includes a reflux diode (not illustrated). The reflux diode may be incorporated in the switching element or may be externally provided.

Figure 3:
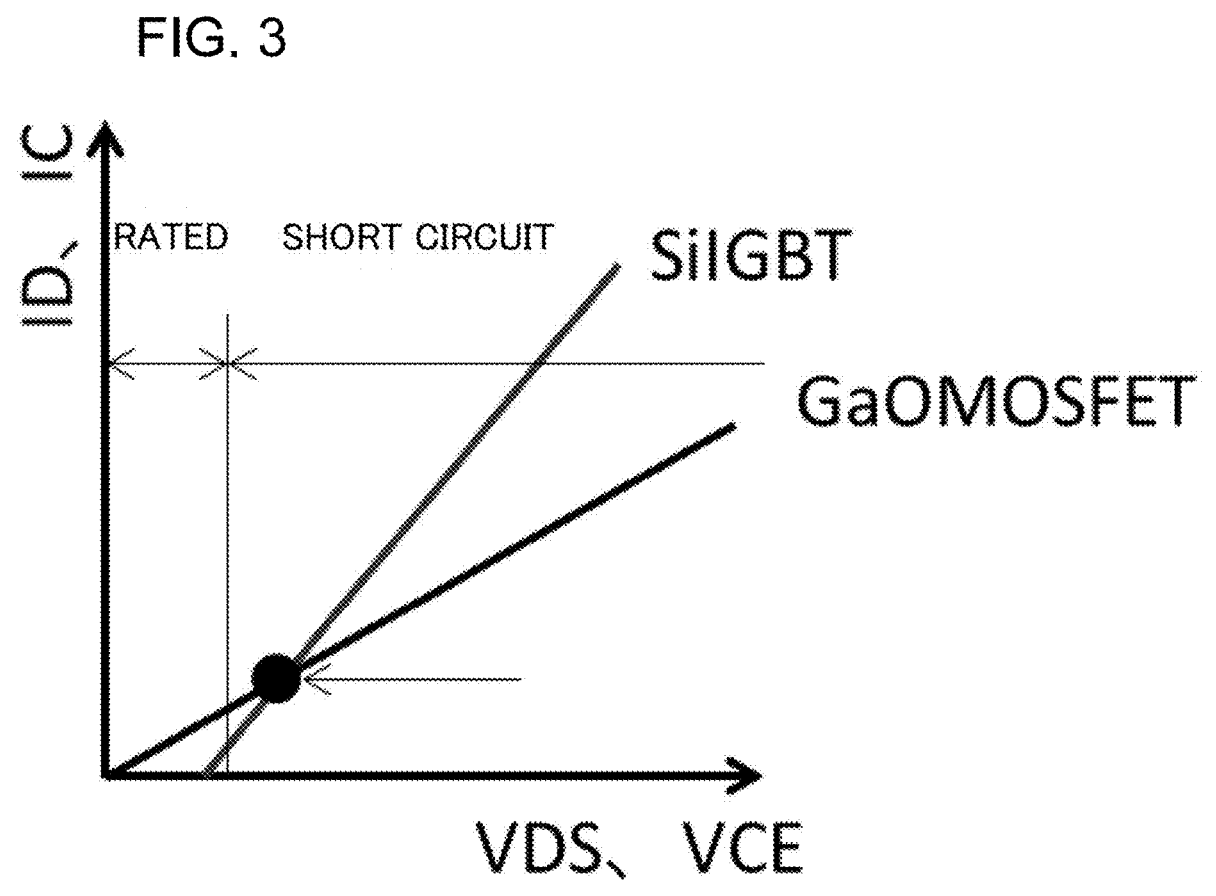

FIG. 3 illustrates relationship between current-voltage characteristics when a forward current flows through the first switching element in FIG. 2 and current-voltage characteristics when a current flows through the second switching element in FIG. 2. FIG. 3 illustrates an example in a case where the first switching element is a silicon-based IGBT and the second switching element is a gallium oxide-based MOSFET. As illustrated in FIG. 3, a current value at a cross point of the current-voltage characteristics of the first switching element and the current-voltage characteristics of the second switching element is greater than a rated current value of the power conversion circuit of the power conversion apparatus. Therefore, in a case where the power conversion circuit of the power conversion apparatus 3 operates within a range of a rated current, the current flows through the second switching element (gallium oxide-based MOSFET). At the time of short-circuit, the Si-based IGBT having a longer short-circuit withstand time bears the current, which makes it possible to prevent the gallium oxide-based MOSFET from being broken by a short-circuit current. Accordingly, it is possible to realize the power conversion apparatus excellent in the short-circuit current resistance while maximizing advantages of the gallium oxide-based MOSFET excellent in switching characteristics such as switching speed within the range of the rated current. Further, in the embodiment of the present disclosure, using the first switching element (silicon-based IGBT) and the second switching element (gallium oxide-based MOSFET) in combination makes it possible to minimize the number of gate drivers corresponding to the switching elements. Moreover, according to the embodiment of the present disclosure, since it is unnecessary to separately control the first switching element and the second switching element, it is possible to achieve the above-described effects without complicating the control programs and the like.

Figure 4A:
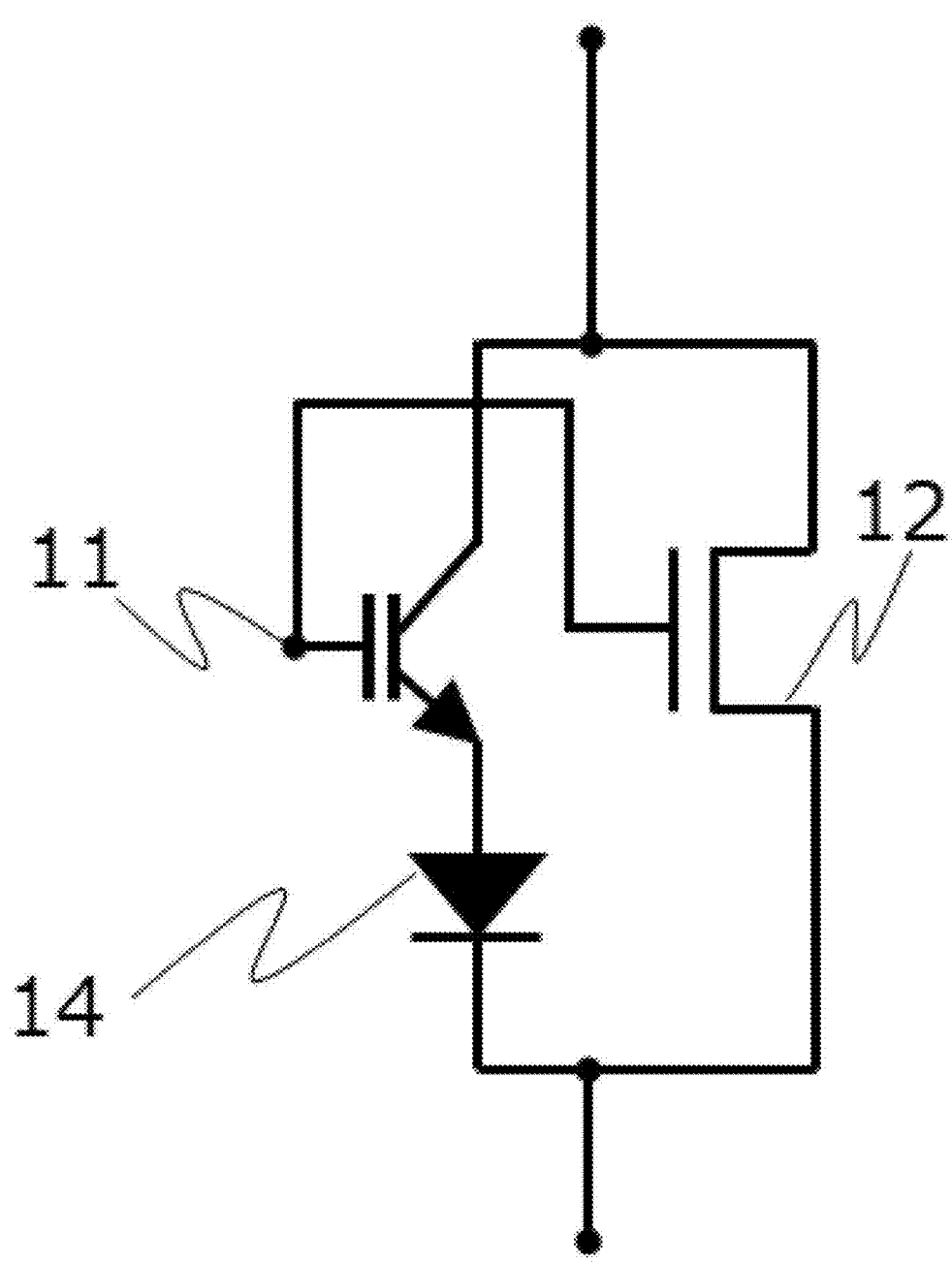
FIG. 4A is a diagram schematically illustrating switching circuits in which the first switching element and the second switching element are connected in parallel according to the embodiments of the present disclosure.
Figure 4B:
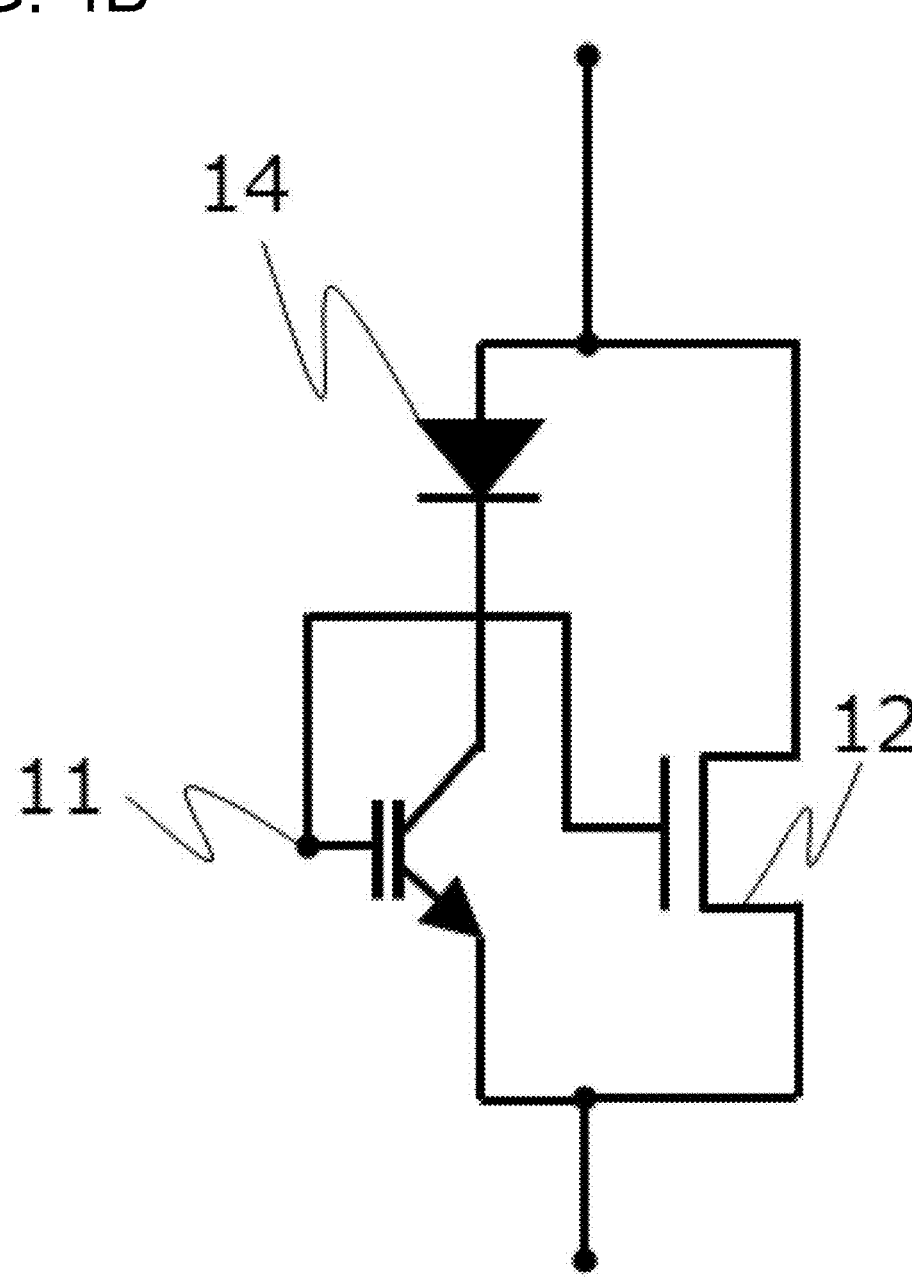
FIG. 4B is a diagram schematically illustrating switching circuits in which the first switching element and the second switching element are connected in parallel according to the embodiments of the present disclosure.

The configuration for making the current value at the cross point of the current-voltage characteristics of the first switching element and the current-voltage characteristics of the second switching element greater than the rated current value of the power conversion circuit of the power conversion apparatus as illustrated in FIG. 3 is not particularly limited unless it interferes with the present disclosure. In the embodiment of the present disclosure, appropriately combining the characteristics of the first switching element and/or the second switching element makes it possible to make the current value at the cross point greater than the rated current value of the power conversion circuit of the power conversion apparatus. In the embodiment of the present disclosure, the current value at the cross point may be increased by, for example, shifting a graph of the current-voltage characteristics of the first switching element in FIG. 3 rightward or reducing a gradient of the graph. Alternatively, the current value at the cross point may be increased by, for example, increasing a gradient of a graph of the current-voltage characteristics of the second switching element. As the configuration for increasing a rising voltage of the first switching element, for example, arrangement of a diode (for example, PN diode) in series to the first switching element as illustrated in FIG. 4A and FIG. 4B is considered. Further, as a method of increasing the gradient of the graph of the current-voltage characteristics of the second switching element, for example, use of a device having lower on-resistance as the second switching element is considered. In the embodiment of the present disclosure, for example, a trench MOSFET is preferably used as the second switching element.

Figure 5:
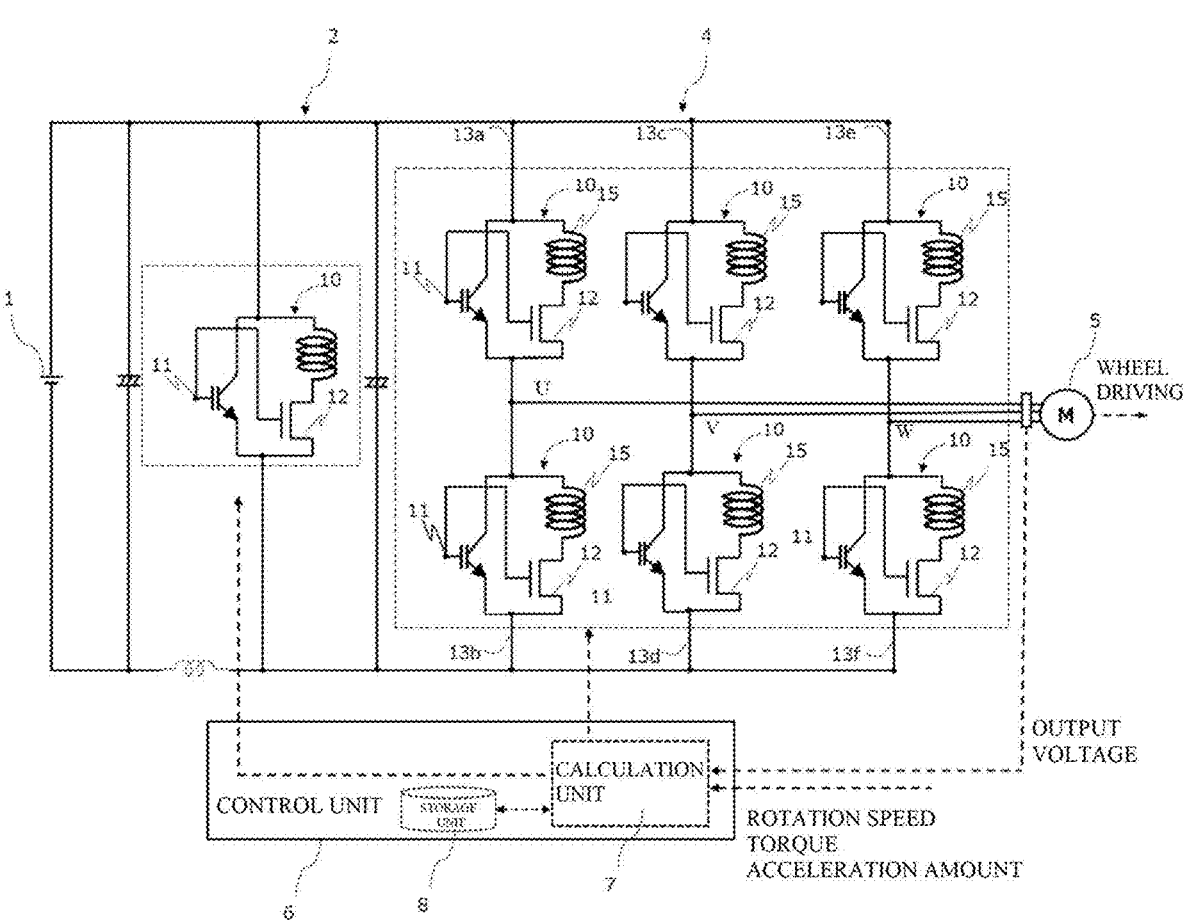
FIG. 5 is a circuit diagram schematically illustrating a power conversion apparatus according to a second embodiment of the present disclosure.

FIG. 5 illustrates an example of circuit configurations of the DC-DC converter 2 and the inverter 4 according to a second embodiment of the present disclosure. As illustrated in FIG. 5, the DC-DC converter 2 and the inverter 4 are configured using the plurality of switching circuits 10. The switching circuits 10 are provided on a power supply path between the battery 1 and the motor 5, and operation of each of the switching circuits 10 is controlled by the control unit 6. Each of the switching circuits 10 includes the first switching element 11 and the second switching element 12. A configuration of each of the switching circuits 10 is described in detail below.

The other configurations of the DC-DC converter 2 and the inverter 4 except for the configurations of the switching circuits 10 are common to configurations of a well-known DC-DC converter and a well-known inverter. For example, the DC-DC converter includes the switching circuit 10, an inductor, and a smoothing capacitor. The inverter 4 includes six switching circuits 10. The switching circuits 10 are provided on the U-phase upper arm 13a, the U-phase lower arm 13b, the V-phase upper arm 13c, the V-phase lower arm 13d, the W-phase upper arm 13e, and the W-phase lower arm 13f. The configurations of the DC-DC converter 2 and the inverter 4 in FIG. 5 are illustrative, and are appropriately changeable depending on an application. Furthermore, the power conversion apparatus 3 may include only a step-up (or step-down) DC-DC converter. As illustrated by dotted lines in FIG. 5, the calculation unit 7 including a CPU (Central Processing Unit) and the storage unit 8 including a non-volatile memory are provided in the control unit 6. A signal input to the driving control unit 6 is provided to the calculation unit 507, and the calculation unit 7 generates a feedback signal for each of the switching elements by performing necessary calculation. The storage unit 8 temporarily holds a calculation result of the calculation unit 7 and stores physical constants, functions, and the like necessary for driving control in a format of a table, and appropriately outputs the physical constants, the functions, and the like to the calculation unit 7. Well-known configurations are applicable to the calculation unit 7 and the storage unit 8, and processing capabilities and the like of the calculation unit 7 and the storage unit 8 are also optionally selectable.

Each of the switching circuits 10 includes the first switching element 11 and the second switching element 12. The first switching element 11 and the second switching element 12 are connected in parallel to each other. Further, a reactor 15 is connected in series to the second switching element 12. The first switching element 11 includes, for example, a silicon-based MOSFET or a silicon-based IGBT. The second switching element 12 is not particularly limited unless it interferes with the present disclosure. In the embodiment of the present disclosure, the second switching element is preferably a switching element including a wide bandgap semiconductor (for example, gallium nitride, silicon carbide, gallium oxide, or diamond). The switching element is not particularly limited unless it interferes with the present disclosure, and may be an MOSFET or an IGBT. More specifically, examples of the second switching element include a gallium oxide-based MOSFET, a gallium oxide-based IGBT, a gallium nitride-based HEMT, a SiC-based MOSFET or SiC-based IGBT, and a Si-based MOSFET or Si-based IGBT. In the embodiment of the present disclosure, the second switching element is preferably a gallium oxide-based MOSFET, a gallium oxide-based IGBT, a gallium nitride-based HEMT, a SiC-based MOSFET, or a SiC-based IGBT. Further, in the embodiment of the present disclosure, the second switching element preferably includes a reflux diode (not illustrated). The reflux diode may be incorporated in the switching element or may be externally provided. In addition, the reactor is not particularly limited, and may be a well-known reactor.

Figure 6:
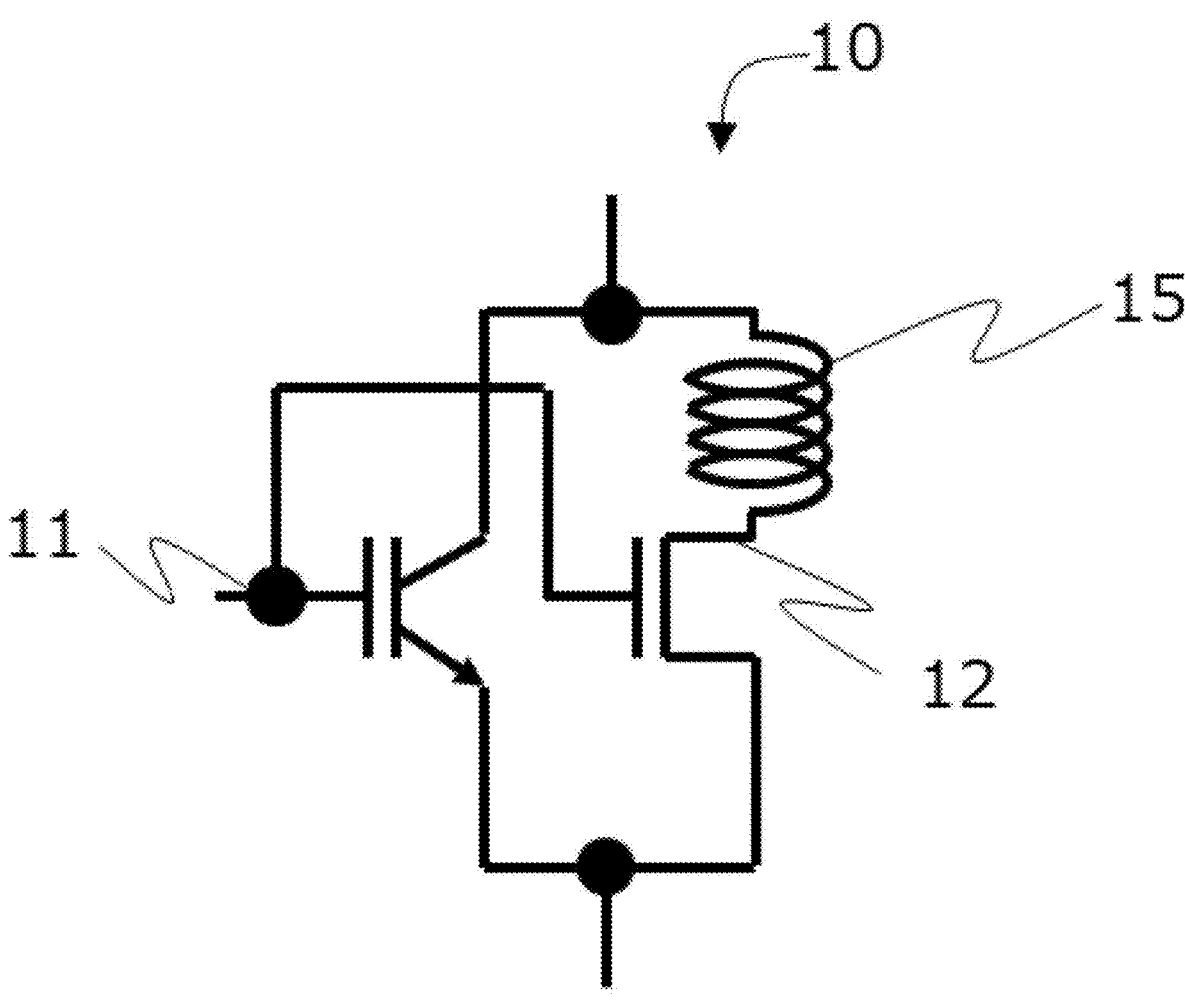
FIG. 6 is a diagram schematically illustrating a switching circuit in which a first switching element and a second switching element are connected in parallel according to the second embodiment of the present disclosure.

FIG. 6 schematically illustrates one switching circuit 10 in FIG. 5, namely, a circuit in which the first switching element 11 and the second switching element 12 are connected in parallel, and the reactor 15 is connected in series to the second switching element 12. In the switching circuit 10, during normal operation, the first switching element bears the voltage applied to the first switching element 11 side, and the second switching element 12 and the reactor 15 bear the voltage applied to the second switching element 12 side. At a time when a short-circuit current is generated, a time rate of change in the current flowing through the switching circuit 10 is drastically increased; however, the reactor 15 bears a predetermined voltage of the increased amount, which makes it possible to reduce the voltage applied to the second switching element to the predetermined voltage or less. In other words, connecting the second switching element 12 and the reactor 15 in series to each other makes it possible to suppress the short-circuit current flowing through the second switching element when the short-circuit current is generated in the switching circuit 10, and to protect the second switching element from being broken by the short-circuit current. Here, inductance of the reactor 15 is adjusted to a value causing the voltage applied to the first switching element when the predetermined short-circuit current is generated in the switching circuit 10 not to exceed an allowable withstand voltage value of the first switching element. Accordingly, it is possible to realize the power conversion apparatus excellent in the short-circuit current resistance while maximizing advantages of the gallium oxide-based MOSFET excellent in switching characteristics such as switching speed within the range of the rated current. Further, in the embodiment of the present disclosure, using the first switching element (silicon-based IGBT) and the second switching element (gallium oxide-based MOSFET) in combination makes it possible to minimize the number of gate drivers corresponding to the switching elements. Moreover, according to the embodiment of the present disclosure, since it is unnecessary to separately control the first switching element and the second switching element, it is possible to achieve the above-described effects without complicating the control programs and the like.

Note that the plurality of embodiments according to the present disclosure may be combined, and some components may be applied to other embodiments. In addition, the number of some components may be increased/decreased, and may be further combined with other well-known technique. Modifications such as partial omission may be made unless it interferes with the present disclosure, and such modifications are also included in the embodiments of the present disclosure.

The embodiments of the present invention are exemplified in all respects, and the scope of the present invention includes all modifications within the meaning and scope equivalent to the scope of claims.

REFERENCE SIGNS LIST

1 Battery
2 DC-DC converter
3 Power conversion apparatus
4 Inverter
5 Motor
6 Control unit
7 Calculation unit
8 Storage unit
10 Switching circuit
11 First switching element
12 Second switching element
13a, 13c, 13e Upper arm of inverter
13b, 13d, 13f Lower arm of inverter
14 Diode
15 Reactor

What is claimed is:

1. A power conversion circuit, comprising:
a first switching element and a second switching element connected in parallel to each other; and
a control unit configured to control turn-on/off of each of the first and second switching elements, wherein
a current value at a point of intersection of a first curve, which represents current-voltage characteristics of the first switching element when a forward current flows through the first switching element, and a second curve, which represents current-voltage characteristics of the second switching element when a current flows through the second switching element, has a higher value than a rated current value of the power conversion circuit.

2. The power conversion circuit according to claim 1, wherein a voltage value at the point of intersection is twice or more the rated current value of the power conversion circuit.

3. The power conversion circuit according to claim 1, wherein the second switching element is a switching element including a wide bandgap semiconductor.

4. The power conversion circuit according to claim 1, wherein the second switching element includes a gallium oxide-based MOSFET, a gallium oxide-based IGBT, a gallium nitride-based HEMT, a SiC-based MOSFET, or a SiC-based IGBT.

5. The power conversion circuit according to claim 1, wherein the second switching element is a gallium oxide-based MOSFET.

6. The power conversion circuit according to claim 1, wherein the second switching element is a trench MOSFET.

7. The power conversion circuit according to claim 1, wherein the first switching element includes a silicon-based MOSFET or a silicon-based IGBT.

8. The power conversion circuit according to claim 1, further comprising a diode connected in series to the first switching element.

9. A power conversion apparatus performing power conversion between a power supply and a load, the power conversion apparatus comprising a power conversion circuit provided on a power supply path from the power supply to the load, wherein
the power conversion circuit is the power conversion circuit according to claim 1.

10. A control system comprising the power conversion apparatus according to claim 9.

11. A control system comprising the power conversion circuit according to claim 1.

12. A power conversion circuit, at least comprising:
a first switching element and a second switching element connected in parallel to each other;
a control unit configured to control turn-on/off of each of the first and second switching elements; and
a reactor connected in series to the second switching element,
wherein inductance of the reactor is adjusted to a value causing a voltage applied to the first switching element when a predetermined short-circuit current is generated in the power conversion circuit not to exceed an allowable withstand voltage value of the first switching element.

13. The power conversion circuit according to claim 12, wherein the second switching element is a switching element including a wide bandgap semiconductor.

14. The power conversion circuit according to claim 12, wherein the second switching element includes a gallium oxide-based MOSFET, a gallium oxide-based IGBT, a gallium nitride-based HEMT, a SiC-based MOSFET, or a SiC-based IGBT.

15. The power conversion circuit according to claim 12, wherein the second switching element is a gallium oxide-based MOSFET.

16. The power conversion circuit according to claim 12, wherein the first switching element includes a silicon-based MOSFET or a silicon-based IGBT.

* * * * *